United States Patent
Francis

(10) Patent No.: US 6,329,861 B1
(45) Date of Patent: Dec. 11, 2001

(54) CLOCK GENERATOR CIRCUIT

(75) Inventor: Russell Francis, Cam Dursley (GB)

(73) Assignee: STMicroelectronics Limited, Almondsbury Bristol (GB)

( * ) Notice: Subject to any disclaimer, the term of this patent is extended or adjusted under 35 U.S.C. 154(b) by 0 days.

(21) Appl. No.: 09/690,586

(22) Filed: Oct. 17, 2000

(30) Foreign Application Priority Data

Oct. 28, 1999 (GB) .................................................. 9925593

(51) Int. Cl.[7] .................................................. G06F 1/04
(52) U.S. Cl. .................................................. 327/291; 327/99
(58) Field of Search .................................... 327/291, 293, 327/294, 299, 99, 113, 115, 117, 172

(56) References Cited

U.S. PATENT DOCUMENTS

| | | | |
|---|---|---|---|
| 5,390,190 | * 2/1995 | Nanda et al. | 327/291 |
| 5,604,452 | 2/1997 | Huang | 327/99 |
| 5,794,021 | * 8/1998 | Hewitt | 327/291 |
| 5,914,996 | 6/1999 | Huang | 377/39 |
| 6,043,692 | * 3/2000 | Linoff | 327/117 |

FOREIGN PATENT DOCUMENTS

4034550-A1 * 2/1991 (DE).
0 551 969 7/1993 (EP).

OTHER PUBLICATIONS

Patent Abstracts of Japan vol. 010, No. 082 (E–392), Apr. 2, 1986 & JP 60 227520 A (Matsushita Denki Sangyo KK) Nov. 12, 1985.
Patent Abstracts of Japan vol. 014, No. 229 (E–0928), May 15, 1990 & JP 02 058921 A (Nippon Telegr & Teleph Corp.) Feb. 28, 1990.
Patent Abstracts of Japan vol. 1996, No. 02, Feb. 29, 1996 & JP 07 273642 A (NEC Corp.) Oct. 20, 1995.

* cited by examiner

*Primary Examiner*—Kenneth B. Wells
*Assistant Examiner*—Linh Nguyen
(74) *Attorney, Agent, or Firm*—Wolf, Greenfield & Sacks, P.C.; James H. Morris

(57) ABSTRACT

A clock generator circuit has a pulse generator with an output connected to a multiplexer and an output connected via a clocked latch to a second input of the multiplexer. The clock latch is transparent in one clock state. By selecting the relationship between the outputs of the pulse generator, different clock outputs can be derived.

7 Claims, 3 Drawing Sheets

CLOCK GENERATOR CIRCUIT

FIELD OF THE INVENTION

The present invention relates to a clock generator circuit and more specifically to a clock generator circuit which in use receives an input clock signal can provide a modified output clock signal.

SUMMARY OF THE INVENTION

According to a first aspect of the present invention there is provided a clock generator circuit comprising a multiplexer, a clocked latch and pulse providing circuitry, said multiplexer having a first input node, a second input node, an output node and a clock terminal, said clocked latch having an input node, an output node and a clock terminal wherein said output node of said clocked latch is coupled to said first input node of said multiplexer and wherein said clocked latch is transparent when its clock terminal is at a first logic level, said pulse providing circuitry having an output connected to said second input node of said multiplexer and to said input node of said clocked latch, said pulse providing circuitry also having a clock terminal, wherein said clock generator circuit further has a clock node connected to said clock terminals of said multiplexer said latch and said pulse providing circuitry.

Preferably said clock node is connected to circuitry in use providing a two state clock signal.

Preferably said pulse providing circuitry comprises a finite state machine in use clocked by said clock signal.

In one embodiment said input node of said clocked latch and said second input of said multiplexer are connected in common and to a single output node of said pulse providing circuitry, whereby the multiplexer has an output which changes state at half the speed of said two state clock signal.

Advantageously, the output of said pulse providing circuitry comprise s a first circuit node in us e providing a first clock signal and a second output node in use providing to said second input node of said multiplexer and said second output node being connected to said input node of said clocked latch.

In a second embodiment the first logic signal is 0 in a first cycle, 1 in a second cycle and 0 in a third cycle and the second logic signal is in said first cycle 1, in said second cycle 1 and in said third cycle 0 whereby an output node of the multiplexer changes state at one third the rate of the two state clock signal.

In a third embodiment the first logic signal is, in a first cycle 1, in a second cycle 0 and in a third cycle 0 and the second logic signal is in the first cycle 0, in the second cycle 1 and in the third cycle 0 whereby the multiplexer output changes state every 1.5 state changes of the clock signal.

BRIEF DESCRIPTION OF THE DRAWINGS

Embodiments of the invention will now be described, by way of example only, with reference to the accompanying drawings in which.

DESCRIPTION OF THE PREFERRED EMBODIMENTS

Figure 1:
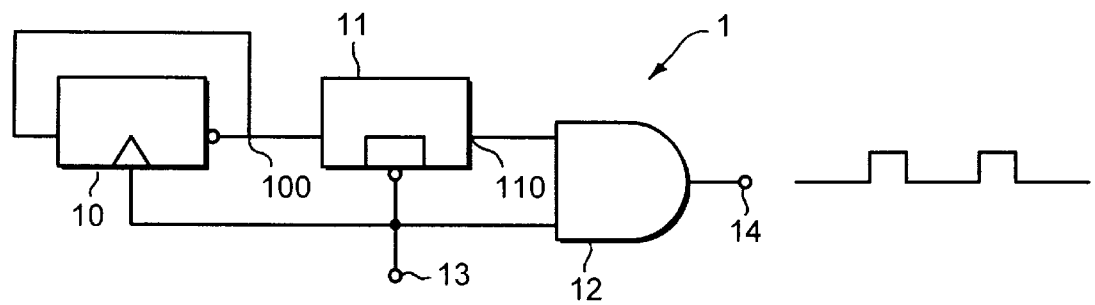
FIG. 1 shows a prior clock generator circuit.

In the various figures like reference numerals refer to like parts.

Referring firstly to FIG. 1, pulse providing circuitry in the form of a simple finite state machine 10 comprises an inverting flip-flop with its output 100 connected to form its input. The output 100 is connected to the input of a clocked latch 11, which latch is transparent when its clock input is held low. Thus, while the clock input is held low, the output signal 110 of the clocked latch 11 corresponds to t he state of the input 100.

The output 110 is fed to one input of the two input AND gate 12, having an output terminal 14.

The clock generator 1 shown in FIG. 1 further has a clock input 13 which is supplied to the flip-flop 10, the clocked latch 11 and to th e second input of the AND gate 12.

Figure 2:
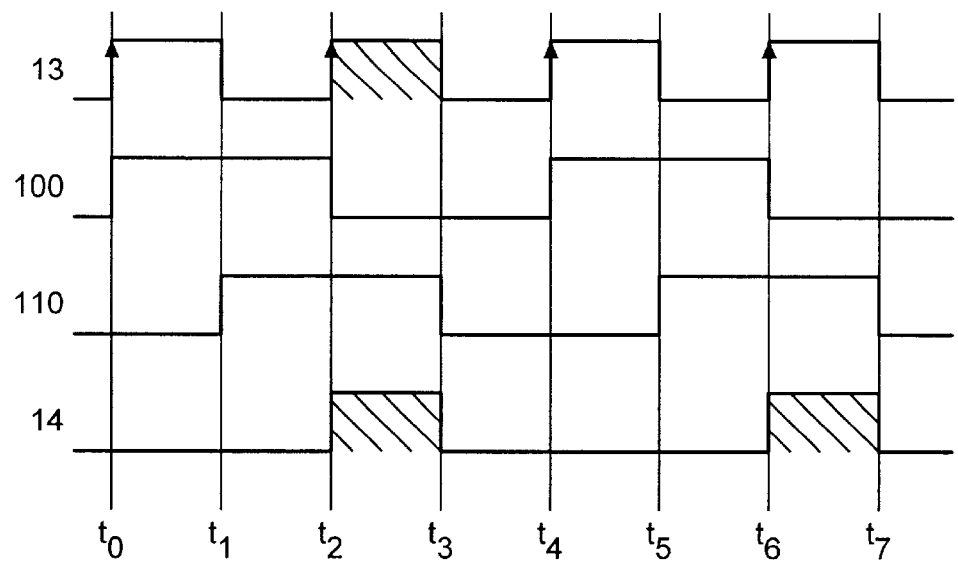
FIG. 2 shows a timing diagram of FIG. 1.

Referring now to FIG. 2, the operation of the clock generator 1 will be described:

The clock signal 13 is a 1:1 mark-space ratio wave form alternating between logic 1 and logic 0. As shown in FIG. 2, the clock signal makes a positive-going transition at times $T_0$, $T_2$, $T_4$ and $T_6$. As a result the output 100 of the finite state machine 10—which responds only to positive-going clock edges—changes state at every second clock pulse. More specifically, at the first rising edge of the clock pulse 13 the finite state machine is seen to change state from logic 0 to logic 1, this state being retained until the next clock signal state change whereupon it reverts to logic 0. The logic 0 state is then retained until the next rising edge of the clock pulse 13 the finite state machine is seen to change state from logic 0 to logic 1, this state being retained until the next clock signal state change whereupon it reverts to logic 0. The logic 0 state is then retained until the next rising edge of the clock pulse 13 at time $T_4$.

As previously noted, the clocked latch 11 is in a latched condition while the clock input 13 is at a logic 1 and thus the latch output 110 will change state at time $T_1$, which is the first time that the clock pulse is at a low level. At this time, the input 110 is at a logic 1 and as a result the latch output 110 goes to logic 1 and remains at logic 1 until the next clock pulse falling edge, namely at time $T_3$. At time $T_3$ the input 100 is at a logic 0 that the latch output 110 falls to logic 0 at time $T_3$ and remains at logic 0 until time $T_5$.

The AND gate 12 reduces a logic 1 output only when both its inputs are at logic 1, and by inspection of FIG. 2, it will be seen that these conditions apply only between times $T_2$ and $T_3$ and times $T_6$ and $T_7$.

By inspection of the waveforms 13 and 14 in FIG. 2 it will be seen that the result of waveform 14 is at half the frequency of the input clock wave form 13 but with a different mark-space ratio.

The person skilled in the art will be aware that the waveforms shown are for the purposes of illustration only and do not show the genuine circuit performance. More specifically, the rising edges of the waveforms 100 and 110 will not be vertical as shown.

It will be noted that the circuit of FIG. 1 does however provide a square output due to the fact that it is the later part of the waveform 110, which is ended together with the clock signal 13 to provide the output signal 14. For example, by the time $T_2$ the waveform 110 will have reached its maximum value and be at a steady settled state.

Figure 3:
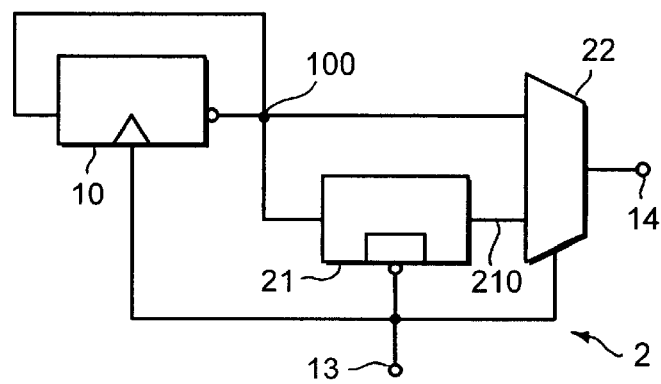
FIG. 3 shows a clock generator in accordance with the first aspect of the present invention.

Referring now to FIG. 3, a first embodiment of the present invention has the output 100 of the pulse providing circuitry 10 provided to the second input of a two-input multiplexer 22. The first input 210 of the multiplexer 22 is provided from a clocked latch 21 similar to clock latch 11 of the embodiment of FIG. 1. The clock generator 2 of FIG. 3, similarly to clock generator 1 shown in FIG. 1 has a clock input 13 supplied to the pulse providing circuitry 10 and to the clocked latch 21, and also supplied to the clock input of the multiplexer 22.

Figure 4:
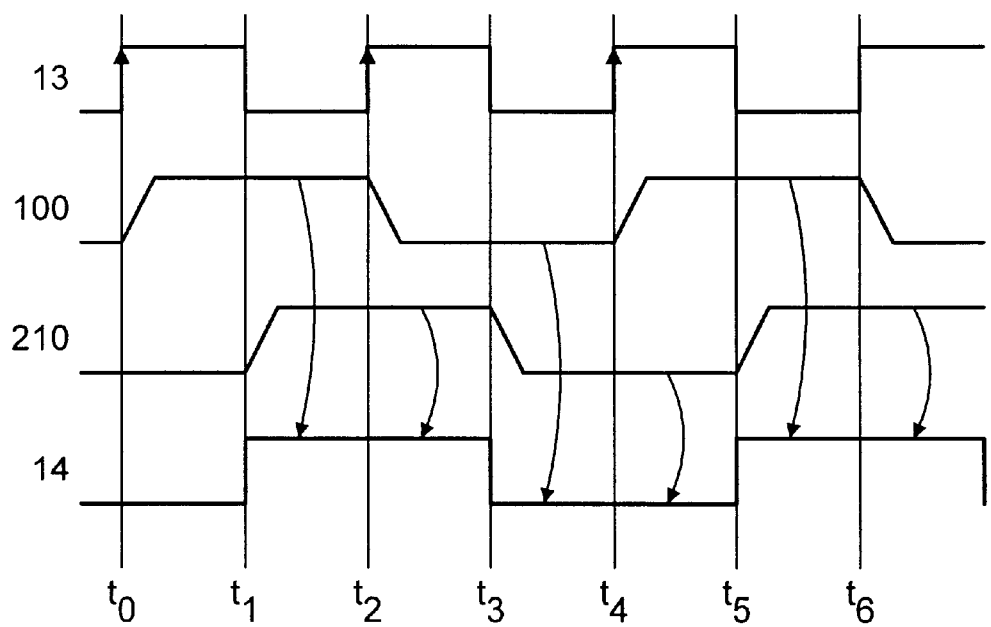
FIG. 4 shows a timing diagram of FIG. 3.

Referring now to FIG. 4, once again the clock pulse 13 is a unitary mark-space waveform. Similarly again to FIG. 2, the finite state machine output 100 changes state only at the rising edges of the clock pulse 13, namely at times $T_0$, $T_2$, $T_4$ and $T_6$.

The output 210 of the clocked latch 21 is similar to waveform 110 in FIG. 2. However, the multiplexer 22 operates in a different way to the AND gate of FIG. 1. More specifically, at time $T_0$, the multiplexer 22 connects the first input 210 to the output 14 and this connection remains in place until time $T_1$. At time $T_1$, the multiplexer is switched by the clock so as to connect the second input 100 to the output 14 and it will be seen from FIG. 4 that the signal 100 at this time has settled to a logic 1. Accordingly, the output 14 makes a transition at time $T_1$ to logic 1. At time $T_2$, the multiplexer is switched by the clock signal to provide its first input as its output and thus between $T_2$ and $T_3$ the logic high at output 210 is provided as the multiplexer output. At time $T_3$, the multiplexer again switches back to the second input which by this stage is at logic 0 and at time $T_4$ switches back to the first input which is again at logic 0.

The result is that the clock 13 is divided to form a unitary mark-space ratio signal of twice the period of clock signal 13 with both portions of each mark, and each space being derived from a respective settled input signal.

Figure 5:
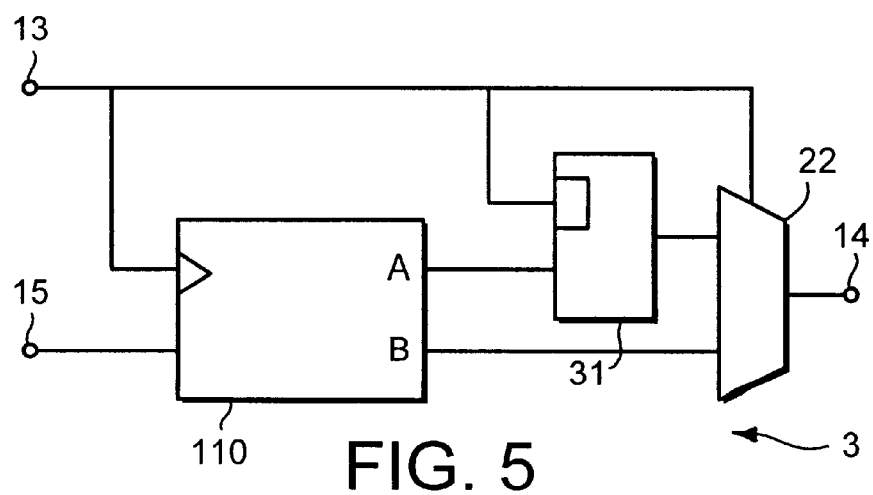
FIG. 5 shows a second embodiment of a clock generator in accordance with the present invention.

A more general case is shown at FIG. 5. In the clock generator 3 of FIG. 5 the simple state machine 10 is replaced by a more complex state machine 110 having two outputs A and B. The latch 31 is different to latches 11 and 21 in that it is transparent while the clock input 13 is at a logic high. It will be understood by those skilled in the art that either type of latch can be used depending, inter alia, upon the connection to the multiplexer.

The finite state machine 110 further has a control input 15 whose function will be described later.

Figure 6:
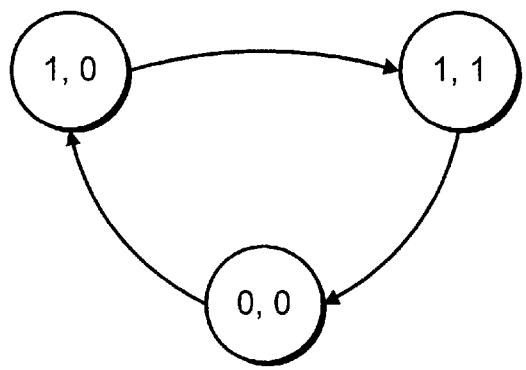
FIGS. 6, 7, and 8 illustrate several different cycles for the state machine illustrated in FIG. 5.

In a first arrangement, the finite state machine 110 cycles through as shown in FIG. 6 from (1,0) to (1,1) to (0,0) and back to (1,0) to provide a divide by 3 clocked output.

In addition to the ability to divide, it is possible to control the initial condition and phase of the output clock. This is achieved by the control input 15 setting the reset state of the finite state machine. If a low frequency phase offset clock is required, then two such state machines can perform this function by starting mutually offset from one another.

Figure 7:
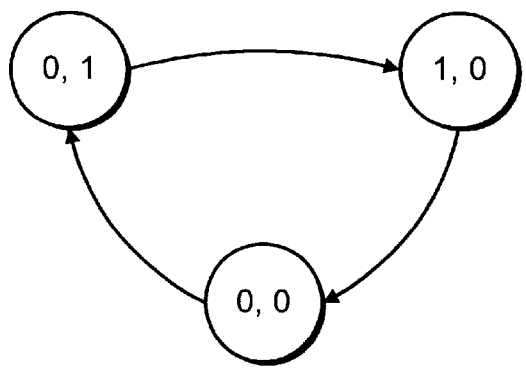

It is also possible to use the invention to provide division by N over 2 where N is an odd integer. The output clock mark-space will depend on the input mark-space. For example, to divide by 3/2 the sequence is as shown in FIG. 7, starting from (0,1) to (1,0) to (0,0) and back to (0,1). This produces an output mark-space of 1:2 based upon a 1:1 input clock.

Figure 8:
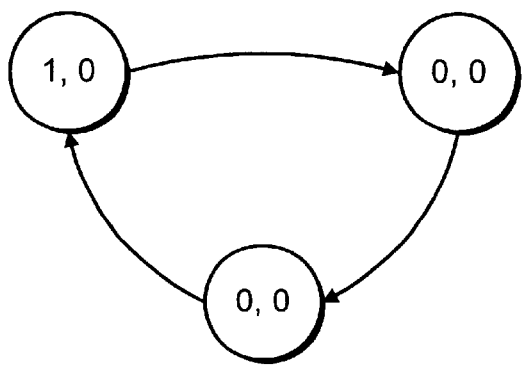

The state machine also has control of the output mark-space of any output clock based upon a known input mark-space. A mark-space variable divide by 3 state machine is as shown in FIG. 8, starting from (1,0) to (0,0) to (0,0) to (1,0).

It is further possible to modify the state machine so that the control input 15 can turn on and off the state machine with the state either frozen or stopped at the next convenient point. Furthermore it is possible to change the divide ratio or phase offset caused by the state machine by suitably switching the state machine. This could be done while the divider is disabled or reset or alternatively while it is running.

What is claimed is:

1. A clock generator circuit comprising a multiplexer, a clocked latch and pulse providing circuitry, said multiplexer having a first input node, a second input node, an output node and a clock terminal, said clocked latch having an input node, an output node and a clock terminal wherein said output node of said clocked latch is coupled to said first input node of said multiplexer and wherein said clocked latch is transparent when its clock terminal is at a first logic level, said pulse providing circuitry having an output connected to said second input node of said multiplexer and to said input node of said clocked latch, said pulse providing circuitry also having a clock terminal, wherein said clock generator circuit further has a clock node connected to said clock terminals of said multiplexer said latch and said pulse providing circuitry.

2. The clock generator circuit of claim 1 wherein said clock node is connected to circuitry in use providing a two state clock signal.

3. The clock generator of claim 2 wherein said pulse providing circuitry comprises a finite state machine in use clocked by said clock signal.

4. The clock generator circuit of claim 2 wherein said input node of said clocked latch and said second input of said multiplexer are connected in common and to a single output node of said pulse providing circuitry, whereby the multiplexer has an output which changes state at half the speed of said two state clock signal.

5. The clock generator circuit of claim 2 wherein the output of said pulse providing circuitry comprises a first circuit node in use providing a first clock signal and a second output node in use providing to said second input node of said multiplexer and said second output node being connected to said input node of said clocked latch.

6. The clock generator of claim 5 wherein the first logic signal is 0 in a first cycle, 1 in a second cycle and 0 in a third cycle and the second logic signal is in said first cycle 1, in said second cycle 1 and in said third cycle 0 whereby an output node of the multiplexer changes state at one third the rate of the two state clock signal.

7. The clock generator of claim 5 wherein the first logic signal is, in a first cycle 1, in a second cycle 0 and in a third cycle 0 and the second logic signal is in the first cycle 0, in the second cycle 1 and in the third cycle 0 whereby the multiplexer output changes state every 1.5 state changes of the clock signal.

\* \* \* \* \*